United States Patent
Park et al.

(10) Patent No.: US 8,410,563 B2
(45) Date of Patent: Apr. 2, 2013

(54) APPARATUSES FOR GENERATING ELECTRICAL ENERGY

(75) Inventors: Young-jun Park, Suwon-si (KR); Seung-nam Cha, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/598,804

(22) Filed: Aug. 30, 2012

(65) Prior Publication Data

US 2012/0319218 A1  Dec. 20, 2012

Related U.S. Application Data

(62) Division of application No. 12/656,814, filed on Feb. 17, 2010, now Pat. No. 8,283,739.

(30) Foreign Application Priority Data

Oct. 13, 2009  (KR) .................. 10-2009-0097449

(51) Int. Cl.
*H01L 29/84* (2006.01)

(52) U.S. Cl. . 257/415; 257/448; 257/449; 257/E27.126; 257/E29.167; 257/E25.007; 310/311; 310/366; 977/948

(58) Field of Classification Search .................. 257/415, 257/448, 449, E27.126, E29.167, E25.007; 310/311, 366; 977/948
See application file for complete search history.

(56) References Cited

U.S. PATENT DOCUMENTS

| 7,294,417 B2 | 11/2007 | Ren et al. |
| 7,446,451 B2 | 11/2008 | Allen et al. |
| 2010/0156249 A1 * | 6/2010 | Choi et al. .................... 310/363 |

FOREIGN PATENT DOCUMENTS

| JP | 05-036999 | 2/1993 |
| JP | 2003-309278 | 10/2003 |
| JP | 2008-177539 | 7/2008 |
| KR | 10-2006-0090455 | 8/2006 |
| KR | 10-2007-0064638 | 6/2007 |
| KR | 10-0809248 | 2/2008 |
| KR | 10-2009-0051597 | 5/2009 |

* cited by examiner

*Primary Examiner* — Tu-Tu Ho
(74) *Attorney, Agent, or Firm* — Harness, Dickey & Pierce, P.L.C.

(57) ABSTRACT

Electrical energy generation apparatuses, in which a solar battery device and a piezoelectric device are combined in a single body by using a plurality of nano wires formed of a semiconductor material having piezoelectric properties.

12 Claims, 6 Drawing Sheets

APPARATUSES FOR GENERATING ELECTRICAL ENERGY

CROSS-REFERENCE TO RELATED APPLICATIONS

This application is a divisional application of U.S. Ser. No. 12/656,814 filed Feb. 17, 2010 now U.S. Pat. No. 8,283,739, now allowed, which claims the benefit of priority under 35 U.S.C. §119 from Korean Patent Application No. 10-2009-0097449, filed on Oct. 13, 2009, in the Korean Intellectual Property Office, the disclosure of each of which is incorporated herein by reference in their entirety.

BACKGROUND

1. Field

Example embodiments relate to apparatuses for generating electrical energy, and more particularly, to electrical energy generation apparatuses in which a solar battery device and a piezoelectric device are combined in a single body.

2. Description of the Related Art

Solar batteries transform energy of solar light into electrical energy by using a p-type semiconductor material and an n-type semiconductor material. If light is incident on such a solar battery, then electrons and holes are generated in the solar battery and move to an n-type electrode and a p-type electrode, thereby causing current to flow through a load connected to the solar battery. Recently, research is actively being conducted on nano structures (e.g., nano wires) in order to enhance the efficiency of solar batteries.

SUMMARY

Example embodiments relate to apparatuses for generating electrical energy. Example embodiments relate to electrical energy generation apparatuses in which a solar battery device and a piezoelectric device are combined in a single body.

Additional aspects will be set forth in part in the description which follows and, in part, will be apparent from the description, or may be learned by practice of the presented embodiments.

According to example embodiments, an electrical energy generation apparatus includes a first electrode, a plurality of nano wires formed on the first electrode and formed of a semiconductor material having piezoelectric properties, and a semiconductor layer forming a p-n junction with the nano wires. The semiconductor layer may be formed on the first electrode to cover lower parts of the nano wires. The apparatus further include a second electrode formed on the semiconductor layer, and a third electrode forming a Schottky contact with upper parts of the nano wires that are exposed via the second electrode.

The nano wires may be formed of an n-type semiconductor material, and the semiconductor layer may be formed of a p-type semiconductor material. The nano wires may have a work function that is less than a work function of the third electrode. The nano wires may include a zinc oxide (ZnO), a lead zirconate titanate (PZT), a polyvinylidene fluoride (PVDF) or combinations thereof.

The semiconductor layer may include at least one material selected from the group consisting of an inorganic thin layer, an organic thin layer and combinations thereof. The first electrode may include at least one material selected from the group consisting of an indium tin oxide (ITO), a carbon nanotube (CNT), a conductive polymer, nano fiber, a nanocomposite, an alloy of gold and palladium, gold (Au), palladium (Pd), platinum (Pt), ruthenium (Ru) and combinations thereof. The second electrode may be formed of a transparent conductive material.

The third electrode may include at least one material selected from the group consisting of platinum (Pt), gold (Au), an indium tin oxide (ITO) and a carbon nanotube (CNT).

The nano wires may be arranged perpendicular, or may be inclined at a set angle, to the first electrode. The set angle may be between 90° and 180° to the first electrode.

According to example embodiments, an electrical energy generation apparatus includes at least one first fiber, a first electrode formed on the at least one first fiber, a plurality of nano wires formed on the first electrode and being formed of a semiconductor material having piezoelectric properties and a semiconductor layer forming a p-n junction with the nano wires. The semiconductor layer may be formed on the first electrode to cover lower parts of the nano wires. The apparatus may further include second electrode formed on the semiconductor layer, and at least one Schottky electrode structure having a third electrode disposed to correspond to the at least one first fiber. The third electrode may form a Schottky contact with upper parts of the nano wires, which are exposed via the second electrode.

The at least one Schottky electrode structure may include the third electrode in the form of wires. The at least one Schottky electrode structure may include a second fiber, and the third electrode formed on the second fiber. The at least one Schottky electrode structure may include a second fiber, a plurality of nano structures formed on the second fiber, and the third electrode formed on the second fiber to coat the nano structures. The at least one first fiber including the nano wires and the at least one Schottky electrode structure may be arranged to be twisted together, or may be arranged to intersect one another.

The at least one Schottky electrode structure may include a cylindrical tube having the at least one first fiber therein, and the third electrode formed on an inner wall of the cylindrical tube. The cylindrical tube may be formed of a transparent flexible material. The third electrode may include a transparent conductive material.

According to example embodiments, an electrical energy generation apparatus includes a first plate and a second plate that are disposed apart from each other, a first electrode formed on the first plate, a plurality of nano wires formed on the first electrode and formed of a semiconductor material having piezoelectric properties and a semiconductor layer forming a p-n junction with the nano wires. The semiconductor layer may be formed on the first electrode to cover lower parts of the nano wires. The apparatus may further include a second electrode formed on the semiconductor layer, and a third electrode formed on a bottom surface of the second plate. The third electrode may form a Schottky contact with upper parts of the nano wires, which are exposed via the second electrode.

According to example embodiments, an electrical energy generation apparatus includes a first plate and a second plate that are disposed apart from each other, a first electrode formed on the first plate, a plurality of first nano wires formed on the first electrode and formed of a semiconductor material and a plurality of semiconductor layers forming a p-n junction with the first nano wires, respectively. The plurality of semiconductor layers may be formed to cover surfaces of the first nano wires. The apparatus may further include a plurality of second electrodes formed to cover surfaces of the semiconductor layers, a third electrode formed on a bottom surface of the second plate, and a plurality of second nano wires formed on a bottom surface of the third electrode. The plurality of second nano wires may form a Schottky contact with the first electrode.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
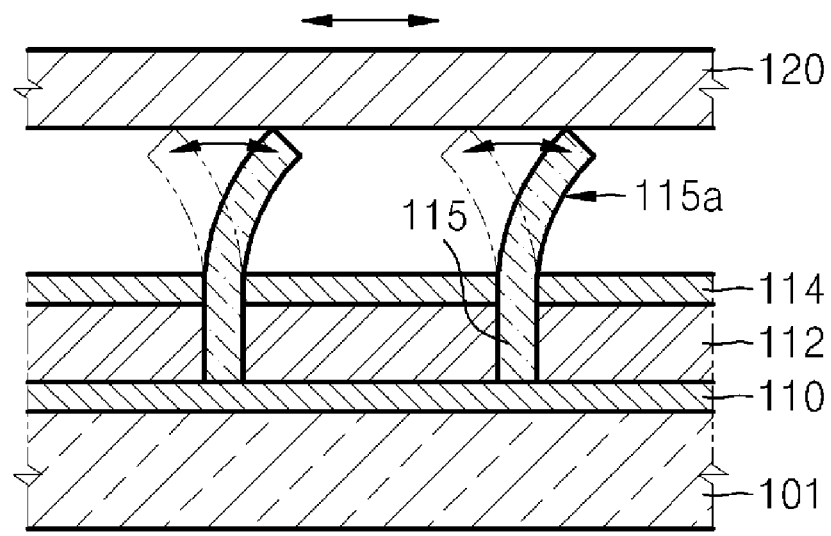
FIG. 1 is a schematic cross-sectional view of an electrical energy generation apparatus according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

In order to more specifically describe example embodiments, various aspects will be described in detail with reference to the attached drawings. However, the present invention is not limited to example embodiments described.

Example embodiments relate to apparatuses for generating electrical energy, and more particularly, to electrical energy generation apparatuses in which a solar battery device and a piezoelectric device are combined in a single body.

FIG. 1 is a schematic cross-sectional view of an electrical energy generation apparatus according to example embodiments.

Referring to FIG. 1, a first electrode 110 is formed on a substrate 101. The substrate 101 may be formed of, for example, a fiber or a plate. The first electrode 110 may be, for example, an n-type electrode. The first electrode 110 may be formed of, but is not limited to, at least one material selected from the group consisting of an indium tin oxide (ITO), a carbon nanotube (CNT), a conductive polymer, nano fiber, a nanocomposite, an alloy of gold (Au) and palladium (Pd), gold (Au), palladium (Pd), platinum (Pt), ruthenium (Ru) and combinations thereof.

A plurality of nano wires 115 are disposed on the first electrode 110. The nano wires 115 may be disposed perpendicular to, or be inclined at a set angle to, the first electrode 110. The set angle may be between 90° and 180° to the first electrode 110. The nano wires 115 may be formed of a semiconductor material having piezoelectric properties. That is, the nano wires 115 may be formed of a semiconductor material that exhibits piezoelectric properties when tension is applied thereto. If the first electrode 110 is an n-type electrode, the nano wires 115 may be formed of, for example, an n-type semiconductor material. For example, the nano wires 115 may include, but are not limited to, a zinc oxide (ZnO), a lead zirconate titanate (PZT), polyvinylidene fluoride (PVDF) or combinations thereof.

A semiconductor layer 112 is formed on the first electrode 110 to cover (or surround) lower parts of the nano wires 115. The semiconductor layer 112 forms a p-n junction with the nano wires 115 and may be formed of, for example, a p-type semiconductor material. The semiconductor layer 112 may include one selected from the group consisting of an inorganic thin layer, an organic thin layer and a composite layer thereof. The composite layer may be a composite inorganic-organic layer. A second electrode 114 is formed on the semiconductor layer 112. The second electrode 114 may be, for example, a p-type electrode. The second electrode 114 may include a transparent conductive material (e.g., an ITO or an aluminum zinc oxide (AZO)). Upper parts 115a of the nano wires 115 are exposed via the second electrode 114.

A third electrode 120 is disposed above the second electrode 114 in order to form a Schottky contact with the exposed nano wires 115. The third electrode 120 may have a work function equal to, or greater than, those of the nano wires 115. For example, the third electrode 120 may be formed of a material having a work function equal to, or greater than, about 4.5 eV. For example, the third electrode 120 may include, but is not limited to, gold (Au), platinum (Pt), ITO or a CNT.

The electrical energy generation apparatus illustrated in FIG. 1 includes a solar battery device and a piezoelectric device that are combined in a single body. The first and second electrodes 110 and 114, and the nano wires 115 and the semiconductor layer 112, which are disposed between the first and second electrodes 110 and 114, collectively form the solar battery device. The first and third electrodes 110 and 120, and the nano wires 115, which are disposed on the first electrode 110 and form a Schottky contact with the third electrode 120, collectively form the piezoelectric device. In the solar battery device, if external solar light is incident on the transparent second electrode 114, then electrons and holes are separated from nano wires 115 and semiconductor layer 112 that form the p-n junction together and move towards the first and second electrodes 110 and 114. The moving electrons and holes are then collected in the first and second electrodes 110 and 114, thus generating electrical energy.

In the piezoelectric device, electric energy is generated by a friction between the third electrode 120 and the nano wires 115. That is, when the third electrode 120 or the nano wires 115 are moved relative to the other, the upper parts 115a of the nano wires 115 are deformed (e.g., the upper parts 115a of the nano wires 115 are bent) by the movement of the third electrode 120. In this case, if tension is repeatedly applied to and removed from the nano wires 115, then a potential difference occurs between the first and third electrodes 110 and 120, thus generating electrical energy from the flow of electrons caused by the potential difference.

Accordingly, in example embodiments, the electrical energy generation apparatus, in which the solar battery device and the piezoelectric device are combined in a single body, may be manufactured using the nano wire 115 formed of a semiconductor material having piezoelectric properties. External input energy may be transformed selectively into electrical energy by using the solar battery device and the piezoelectric device. Also, it is possible to more effectively generate electrical energy regardless of an ambient environment.

In example embodiments, the nano wires 115 and the semiconductor layer 112 are formed of an n-type semiconductor material and a p-type semiconductor material, respectively. The first and second electrodes 110 and 114 are an n-type electrode and a p-type electrode, respectively, but example embodiments are not limited thereto. That is, the nano wires 115 and the semiconductor layer 112 may be formed of a p-type semiconductor material and an n-type semiconductor material, respectively, and the first and second electrodes 110 and 114 may be a p-type electrode and an n-type electrode, respectively.

Figure 2:
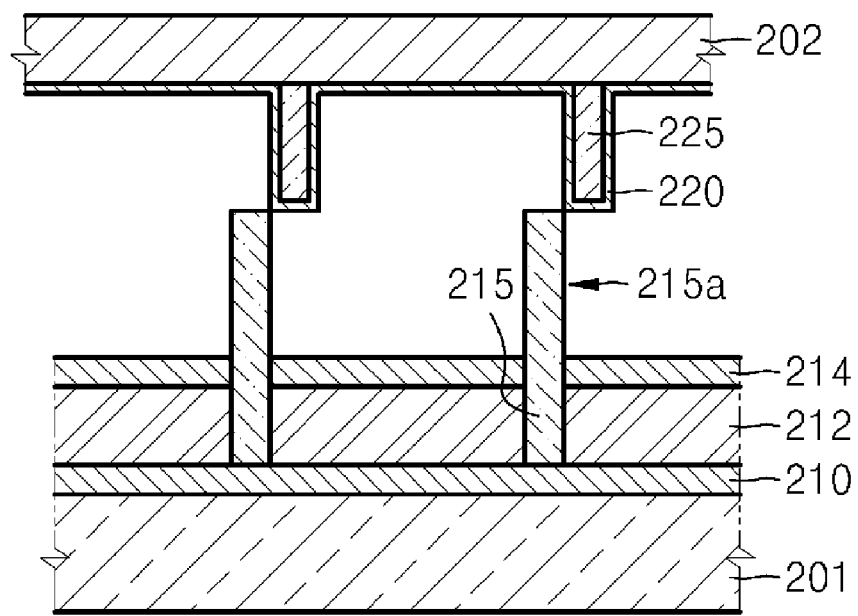
FIG. 2 is a schematic cross-sectional view of an electrical energy generation apparatus according to example embodiments.

FIG. 2 is a schematic cross-sectional view of an electrical energy generation apparatus according to example embodiments. The electrical energy generation apparatus illustrated in FIG. 2 will be described focusing on the differences from the electrical energy generation apparatus illustrated in FIG. 1.

Referring to FIG. 2, a first substrate 201 and a second substrate 202 are disposed apart a set distance from each other. The first and second substrates 201 and 202 may be formed of, for example, fiber or a plate. A first electrode 210 may disposed on the first substrate 201. The first electrode 210 may be, for example, an n-type electrode. A plurality of nano wires 215 are disposed on the first electrode 210. The nano wires 215 may be disposed perpendicular to, or may be inclined at a set angle to, the first electrode 210. The set angle may be between 90° and 180° to the first electrode 210. The nano wires 215 may be formed of a semiconductor material having piezoelectric properties. If the first electrode 210 is an n-type electrode, the nano wires 215 may be formed of an n-type semiconductor material. The nano wires 215 may include, for example, a ZnO, a PZT or a PVDF but are not limited thereof.

A semiconductor layer 212 is formed on the first electrode 210 to cover (or delimit) lower parts of the nano wires 215. The semiconductor layer 212 forms a p-n junction with the nano wires 215. The semiconductor layer 212 may be formed of, for example, a p-type semiconductor material. A second electrode 214 is formed on the semiconductor layer 212. The second electrode 214 may be a p-type electrode. The second electrode 214 may be formed of a transparent conductive material. Upper parts 215a of the nano wires 215 are exposed via the second electrode 214.

A plurality of nano structures 225 are formed on a bottom surface of the second substrate 202. For example, the nano structures 225 may be arranged in the form of nano wires. A third electrode 220 is formed below the second substrate 202 so that the nano structures 225 are coated with the third electrode 220. The third electrode 220 is disposed to form a Schottky contact with the exposed upper parts 215a of the nano wires 215. The third electrode 220 may have a work function equal to, or greater than, those of the nano wires 215. If the nano structures 225 are formed on the bottom surface of the second substrate 202 and the third electrode 220 is formed to coat the nano structures 225, then contact areas between the third electrode 220 and the nano wires 215 may be increased, thus effectively generating electrical energy.

In example embodiments, the nano wires 215 and the semiconductor layer 212 are an n-type semiconductor material and a p-type semiconductor material, respectively, and the first and second electrodes 210 and 214 are an n-type electrode and a p-type electrode, respectively, but example embodiments are not limited thereto. That is, the nano wires 215 and the semiconductor layer 212 may be formed of a p-type semiconductor material and an n-type semiconductor material, respectively. In this case, the first and second electrodes 210 and 214 may be a p-type electrode and an n-type electrode, respectively.

Figure 3:
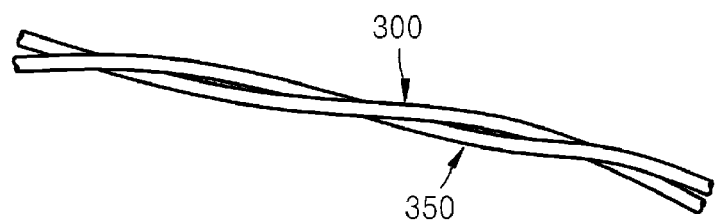
FIG. 3 is a perspective view of an electrical energy generation apparatus according to example embodiments.
Figure 4:
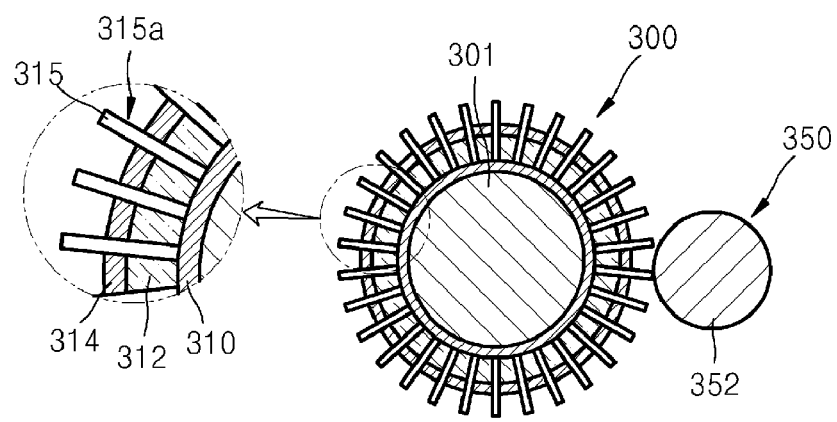
FIG. 4 is a cross-sectional view of the electrical energy generation apparatus illustrated in FIG. 3.

FIG. 3 is a perspective view of an electrical energy generation apparatus according to example embodiments. FIG. 4 is a cross-sectional view of the electrical energy generation apparatus illustrated in FIG. 3. FIGS. 3 and 4 illustrate a fiber type electrical energy generation apparatus.

Referring to FIGS. 3 and 4, the electrical energy generation apparatus includes a fiber structure 300 and a Schottky electrode structure 350. In example embodiments, the electrical energy generation apparatus is constructed such that the fiber structure 300 and the Schottky electrode structure 350 are twisted together. The fiber structure 300 includes a first fiber 301, a first electrode 310 formed on the first fiber 301, a plurality of nano wires 315 disposed on the first electrode 310, a semiconductor layer 312 formed to cover lower parts of the nano wires 315, and a second electrode 314 formed on the semiconductor layer 312. Upper parts 315a of the nano wires 315 are exposed via the second electrode 314.

The first fiber 301 may include, but is not limited to, at least one selected from the group consisting of glass, silicon, polymer, plastic, a CNT, sapphire, a gallium nitride (GaN) and a silicon carbide (SiC) and combinations thereof. The first electrode 310 is formed on the first fiber 301. The first electrode 310 may be, for example, an n-type electrode. The first electrode 310 may be formed of, but is not limited to, at least one material selected from the group consisting of an ITO, a CNT, a conducive polymer, nano fiber, a nanocomposite, an alloy of gold (Au) and palladium (Pd), gold (Au), palladium (Pd), platinum (Pt), a ruthenium (Ru) and combinations thereof.

The nano wires 315 are disposed on the first electrode 310. The nano wires 315 may be arranged perpendicular to the first electrode 310. The nano wires 315 may be formed of a semiconductor material having piezoelectric properties. If the first electrode 310 is an n-type electrode, the nano wires 315 may be formed of an n-type semiconductor material. For example, the nano wires 315 may include, but are not limited to, a ZnO, a PZT or a PVDF. The nano wires 315 may be formed on the first electrode 310 of the first fiber 301 by using a wet process. For example, ZnO nano wires may be formed perpendicular to the first electrode 310 by applying a ZnO layer onto the first electrode 310 of the first fiber 301 and growing the ZnO layer in a desired solution. The nano wires 315 may also be formed using a dry process (e.g., chemical vapor deposition (CVD)).

The semiconductor layer 312 is formed to cover the lower parts of the first electrode 310. The semiconductor layer 312 forms a p-n junction with the nano wires 315. The semiconductor layer 312 may be formed, for example, of a p-type semiconductor material. The semiconductor layer 312 may include an inorganic thin layer, an organic thin layer or a composite layer thereof. The second electrode 314 is formed on the semiconductor layer 312. The second electrode 314 may be a p-type electrode and may include, for example, a transparent conductive material (e.g., an ITO or an AZO).

The Schottky electrode structure 350 includes a third electrode 352 having the shape of wire. The third electrode 352 forms a Schottky contact with the exposed upper parts 315a of the nano wires 315. The third electrode 352 may have a work function equal to, or greater than, those of the nano wires 315. For example, the third electrode 352 may include, but is not limited to, gold (Au), platinum (Pt), an ITO or a CNT.

In example embodiments, the nano wires 315 and the semiconductor layer 312 are formed of an n-type semiconductor material and a p-type semiconductor material, respectively, and the first electrode 310 and the second electrode 314 are an n-type electrode and a p-type electrode, respectively, but example embodiments are not limited thereto. That is, the nano wires 315 and the semiconductor layer 312 may be formed of a p-type semiconductor material and an n-type semiconductor material, respectively. In this case, the first and second electrodes 310 and 314 may be a p-type electrode and an n-type electrode, respectively. Also, in example embodiments, the electrical energy generation apparatus is constructed such that one fiber structure 300 and one Schottky electrode structure 350 are twisted together but may be constructed such that two or more fiber structures and two or more Schottky electrode structures are twisted together.

Figure 5:
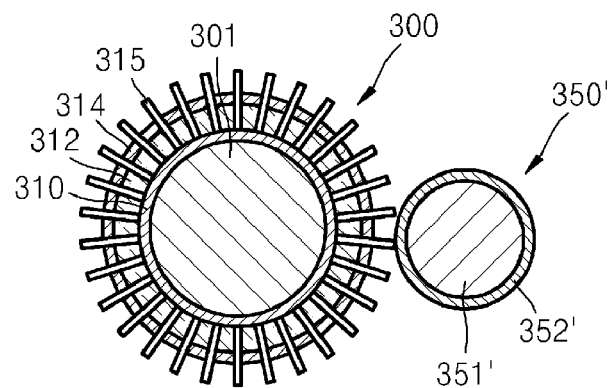
FIG. 5 is a cross-sectional view of an electrical energy generation apparatus according to example embodiments.

FIG. 5 is a cross-sectional view of an electrical energy generation apparatus according to example embodiments. The electrical energy generation apparatus illustrated in FIG. 5 is the same as the electrical energy generation apparatus illustrated in FIG. 4 except for a Schottky electrode structure 350'.

Referring to FIG. 5, the Schottky electrode structure 350' may include a second fiber 351' and a third electrode 352' formed on the second fiber 351'. The third electrode 352' is disposed to a Schottky contact with exposed upper parts 315a of the nano wires 315.

Figure 6:
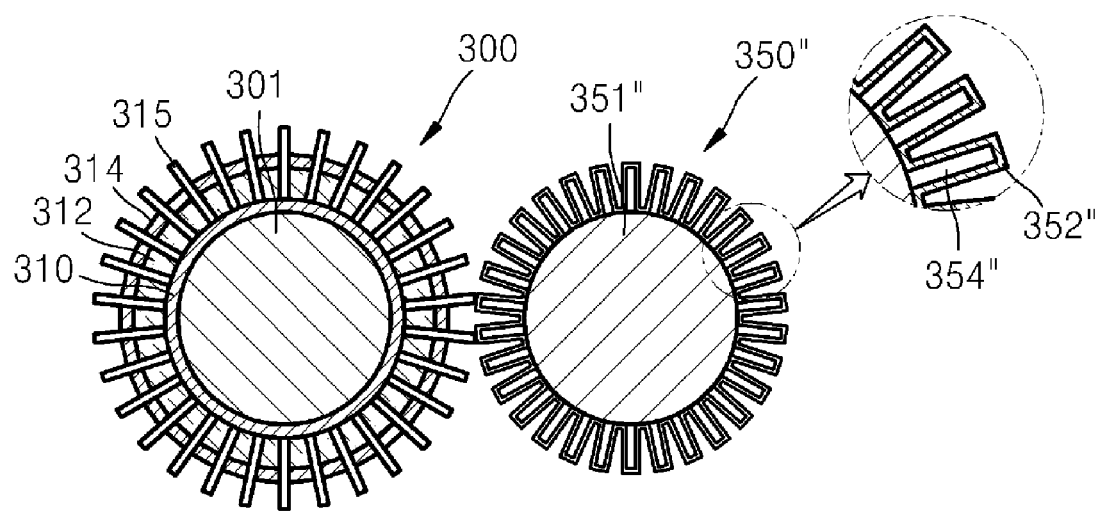
FIG. 6 is a cross-sectional view of the electrical energy generation apparatus according to example embodiments.

FIG. 6 is a cross-sectional view of the electrical energy generation apparatus according to example embodiments. The electrical energy generation apparatus illustrated in FIG. 6 is the same as the electrical energy generation apparatus illustrated in FIG. 4 except for a Schottky electrode structure 350".

Referring to FIG. 6, the Schottky electrode structure 350" may include a second fiber 351", a plurality of nano structures 354" formed on the second fiber 351", and a third electrode 352" formed on second fiber 351" to coat the nano structures 354". The third electrode 352" is disposed to form a Schottky contact with exposed upper parts 315a of the nano wires 315. If the nano structures 354" are formed on the second fiber 351" and the third electrode 352" is formed to coat the nano structures 354", then contact areas between the third electrode 352" and the nano wires 315 may be increased, thus more effectively generating electrical energy. Although not shown in the drawings, a plurality of protrusions may further be formed on the second fiber 351" and the third electrode 352" may be formed to coat the protrusions.

Figure 7:
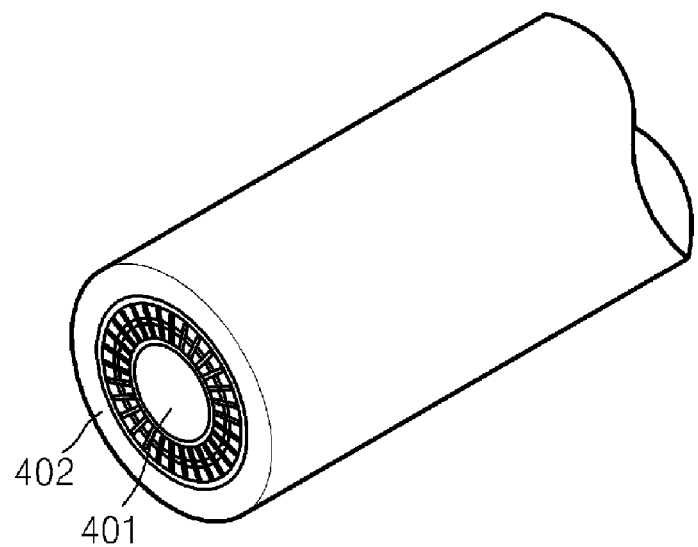
FIG. 7 is a perspective view of the electrical energy generation apparatus according to example embodiments.
Figure 8:
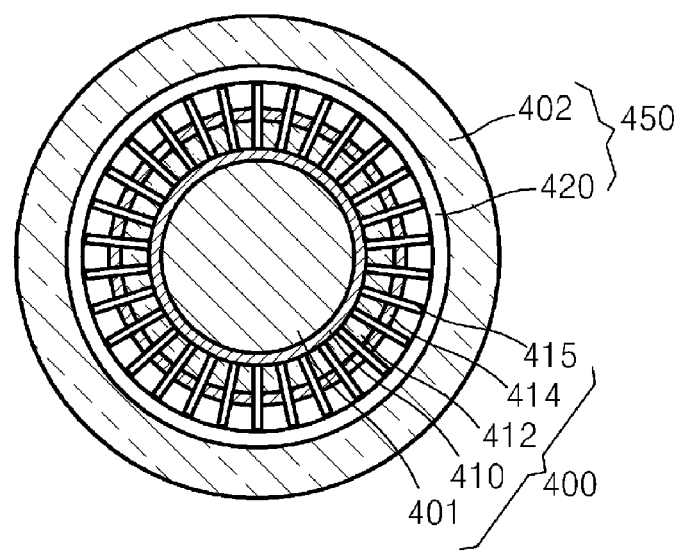
FIG. 8 is a cross-sectional view of the electrical energy generation apparatus illustrated in FIG. 7.

FIG. 7 is a perspective view of the electrical energy generation apparatus according to example embodiments. FIG. 8 is a cross-sectional view of the electrical energy generation apparatus illustrated in FIG. 7. FIGS. 7 and 8 illustrate a coaxial type electrical energy generation apparatus. The electrical energy generation apparatus illustrated in FIGS. 7 and 8 will now be described focusing on the differences from the above embodiments.

Referring to FIGS. 7 and 8, the electrical energy generation apparatus includes a Schottky electrode structure 450 and a fiber structure 400 disposed in the Schottky electrode structure 450. The fiber structure 400 includes a fiber 401, a first electrode 410 formed on the fiber 401, a plurality of nano wires 415 formed on the first electrode 410, a semiconductor layer 412 formed to cover lower parts of the nano wires 415, and a second electrode 414 formed on the semiconductor layer 412. Upper parts of the nano wires 415 are exposed via the second electrode 414.

The fiber 401 may be formed of, but is not limited to, at least one material selected from the group consisting of glass, silicon, plastic, carbon, a CNT, sapphire, a GaN, a SiC and combinations thereof. The first electrode 410 is formed on the fiber 401. The first electrode 410 may be an n-type electrode. The nano wires 415 may be formed on the first electrode 410. The nano wires 415 may be formed of a semiconductor material having piezoelectric properties. If the first electrode 410 is an n-type electrode, the nano wires 415 may be formed of an n-type semiconductor material.

The semiconductor layer 412 is formed on the first electrode 410 to cover lower parts of the nano wires 415. The semiconductor layer 412 forms a p-n junction with the nano wires 415 and may be formed of a p-type semiconductor material. The second electrode 414 is formed on the semiconductor layer 412. The second electrode 414 may be a p-type electrode and may be formed of a transparent conductive material.

The Schottky electrode structure 450 includes a cylindrical tube 402 having the fiber structure 400 therein, and a third electrode 420 formed on an inner wall of the cylindrical tube 402. The cylindrical tube 402 may be formed of, for example, a transparent flexible material. The third electrode 420 is disposed on the inner wall of the cylindrical tube 402 in order to form a Schottky contact with the nano wires 415. The third electrode 420 may be formed of a transparent conductive material. The third electrode 420 may have a work function equal to, or greater than, those of the nano wires 415. For example, the third electrode 420 may include, but is not limited to, gold (Au), platinum (Pt), an ITO or a CNT having a work function equal to, or greater than, about 4.5 eV. Although not shown, a plurality of nano structures or protrusions may further be formed on the inner wall of the cylindrical tube 402 and the third electrode 420 may be formed on the inner wall of the cylindrical tube 402 to coat the nano structures or protrusions.

In example embodiments, the nano wires 415 and the semiconductor layer 412 are formed of an n-type semiconductor material and a p-type semiconductor material, respectively, and the first and second electrodes 410 and 414 are an n-type electrode and a p-type electrode, respectively, but the example embodiments are not limited thereto. That is, the nano wires 415 and the semiconductor layer 412 may be formed of a p-type semiconductor material and an n-type semiconductor material, respectively, and in this case, the first and second electrodes 410 and 414 may be a p-type electrode and an n-type electrode, respectively.

Figure 9:
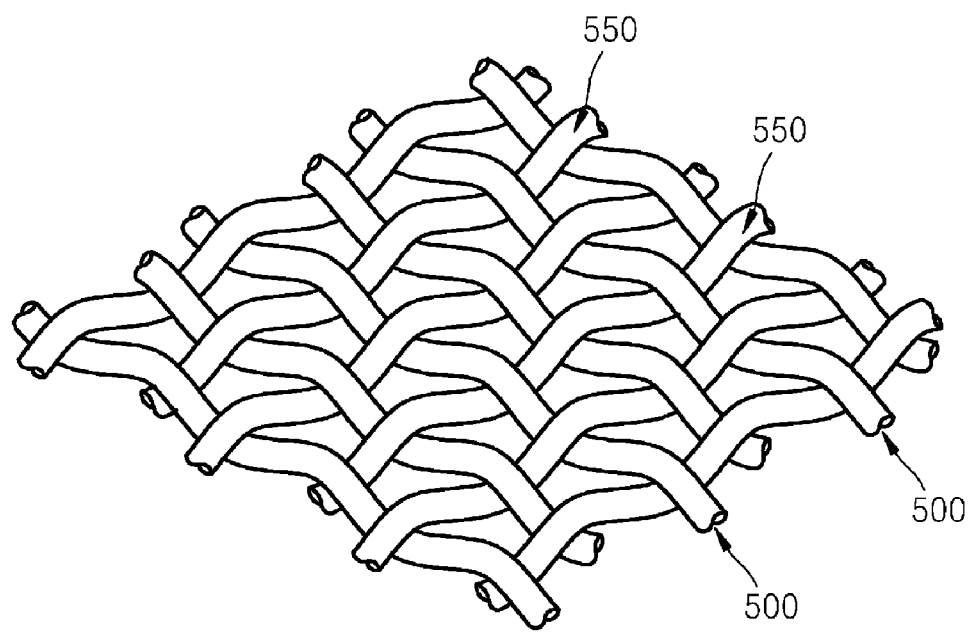
FIG. 9 is a perspective view of an electrical energy generation apparatus according to example embodiments.

FIG. 9 is a perspective view of an electrical energy generation apparatus according to example embodiments. FIG. 9 illustrates a textile type electrical energy generation apparatus.

Referring to FIG. 9, the electrical energy generation apparatus includes a plurality of fiber structures 500 and a plurality of Schottky electrode structures 550. The fiber structures 500 and the Schottky electrode structures 550 are arranged to intersect one another (or interwoven), thus forming a textile structure. Each of the fiber structures 500 according to example embodiments may have the same construction as one of the fiber structures 300 illustrated in FIGS. 3 to 6, and each of the Schottky electrode structures 550 may have the same construction as one of the Schottky electrode structures 350, 350' and 350" illustrated in FIGS. 3 to 6. Although not shown in the drawings, the textile type electrical energy generation apparatus of FIG. 9 may be manufactured by preparing a plurality of coaxial type electrical energy generation apparatuses illustrated in FIGS. 7 and 8 and arranging the electrical energy generation apparatuses to intersect one another.

Figure 10:
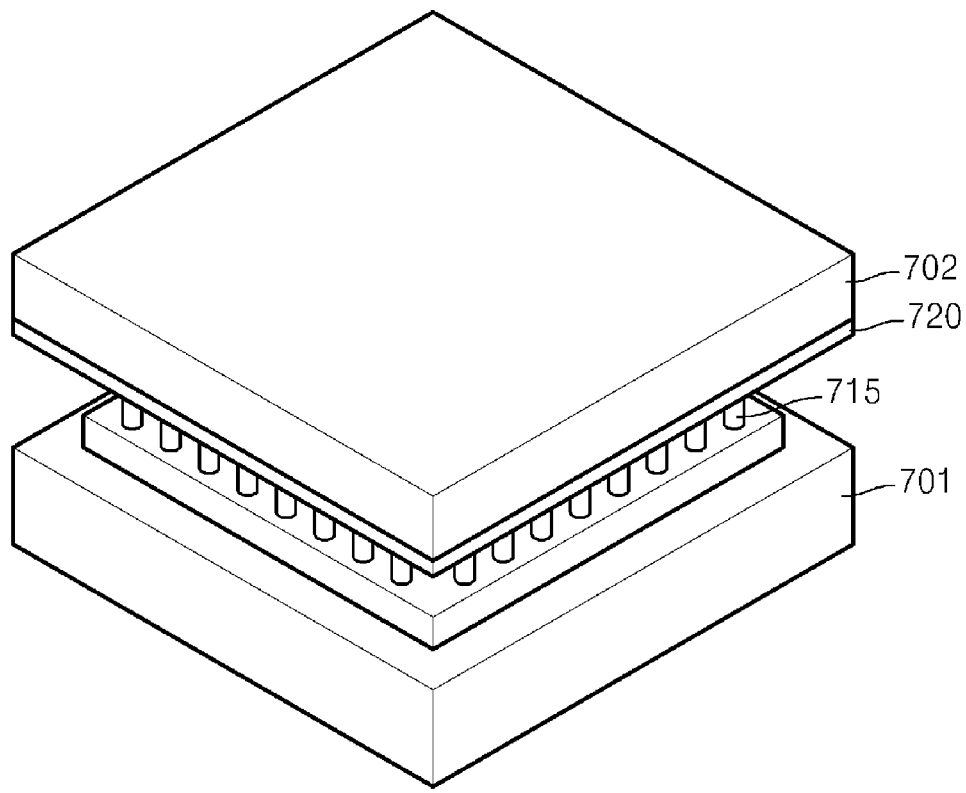
FIG. 10 is a perspective view of an electrical energy generation apparatus according to example embodiments.
Figure 11:
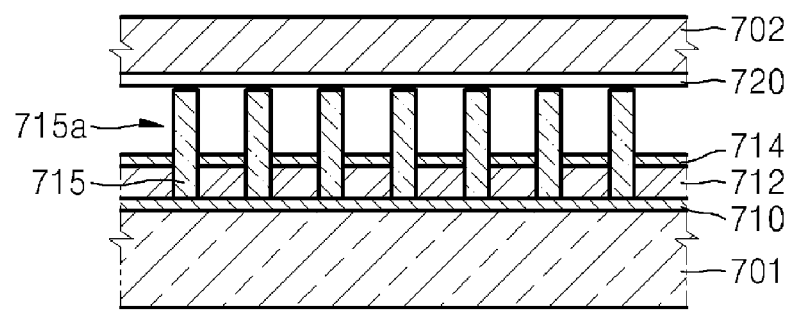
FIG. 11 is a cross-sectional view of the electrical energy generation apparatus illustrated in FIG. 10.

FIG. 10 is a perspective view of an electrical energy generation apparatus according to example embodiments. FIG. 11 is a cross-sectional view of the electrical energy generation apparatus illustrated in FIG. 10. FIGS. 10 and 11 illustrate a flat type electrical energy generation apparatus.

Referring to FIGS. 10 and 11, a first plate 701 and a second plate 702 are disposed apart from each other. The first and second plates 701 and 702 may be formed of, for example, glass, a metal plate, plastic or vinyl but are not limited thereto. A first electrode 710 is formed on the first plate 701. The first electrode 710 may be, for example, an n-type electrode. In this case, the first electrode 710 may include, but is not limited to, at least one material selected from the group consisting of an ITO, a CNT, a conductive polymer, nano fiber, a nanocomposite, an alloy of gold (Au) and palladium (Pd), gold (Au), palladium (Pd), platinum (Pt), ruthenium (Ru) and combinations thereof.

A plurality of nano wires 715 are formed on the first electrode 710. The nano wires 715 may be disposed perpendicular to, or be inclined at a set angle to, the first electrode 710. The set angle may be between 90° and 180° to the first electrode 710. The nano wires 715 may be formed of a semiconductor material having piezoelectric properties. If the first electrode 710 is an n-type electrode, the nano wires 715 may be formed of an n-type semiconductor material.

A semiconductor layer 712 is formed on the first electrode 710 to cover (or enclose) lower parts of the nano wires 715. The semiconductor layer 712 forms a p-n junction with the nano wires 715 and may include, for example, a p-type semiconductor material. The semiconductor layer 712 may be an inorganic thin layer, an organic thin layer or a composite layer thereof. A second electrode 714 is formed on the semiconductor layer 712. The second electrode 714 may be, for example, a p-type electrode. Upper parts 715a of the nano wires 715 are exposed via the second electrode 714.

A third electrode 720 is formed on a bottom surface of the second plate 702. The third electrode 720 may be disposed to form a Schottky contact with the exposed upper parts of the nano wires 715. The third electrode 720 may be formed of a transparent conductive material. The third electrode 720 may have a work function equal to, or greater than, those of the nano wires 715.

In example embodiments, the nano wires 715 and the semiconductor layer 712 are formed of an n-type semiconductor material and a p-type semiconductor material, respectively, and the first and second electrodes 710 and 714 are an n-type electrode and a p-type electrode, respectively, but the example embodiments are not limited thereto. That is, the nano wires 715 and the semiconductor layer 712 may be formed of a p-type semiconductor material and an n-type semiconductor material, respectively, and the first and second electrodes 710 and 714 may be a p-type electrode and an n--type electrode, respectively. Also, although not shown, a plurality of nano structures of protrusions may further be formed on the bottom surface of the second plate 702. In this case, the third electrode 720 may be formed on the bottom surface second plate 702 to coat the nano structures or protrusions.

Figure 12:
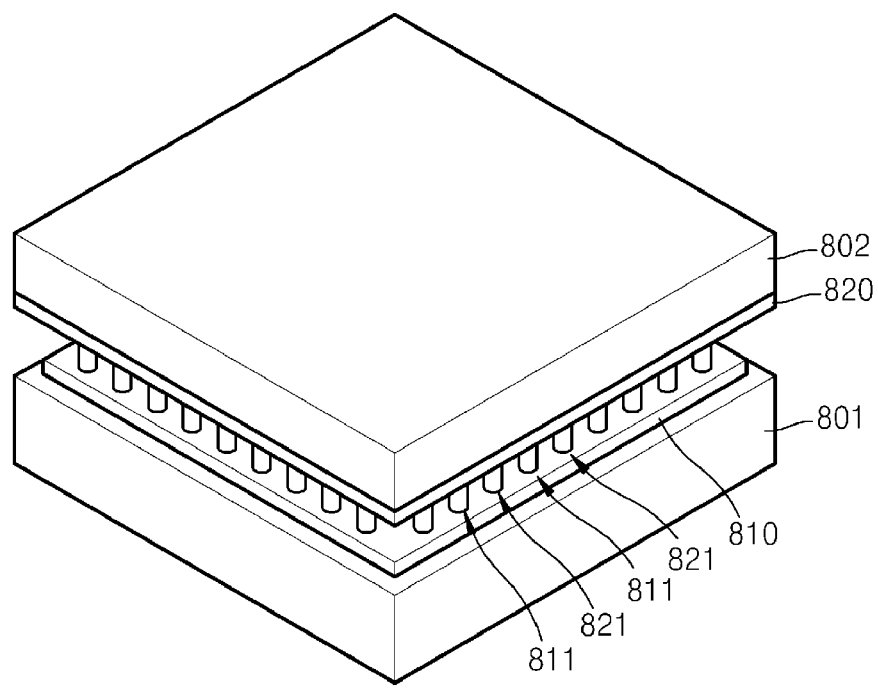
FIG. 12 is a perspective view of an electrical energy generation apparatus according to example embodiments.
Figure 13:
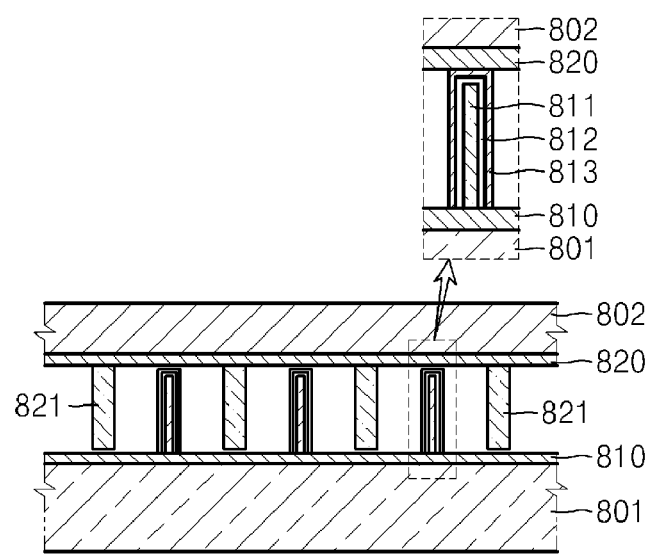
FIG. 13 is a cross-sectional view of the electrical energy generation apparatus illustrated in FIG. 12.

FIG. 12 is a perspective view of an electrical energy generation apparatus according to example embodiments. FIG. 13 is a cross-sectional view of the electrical energy generation apparatus illustrated in FIG. 12. FIGS. 12 and 13 illustrate a flat type electrical energy generation apparatus.

Referring to FIGS. 12 and 13, a first plate 801 and a second plate 802 are disposed apart from each other. The first and second plates 801 and 802 may be formed of glass, metal, plastic or vinyl but are not limited thereto. A first electrode 810 is formed on the first plate 801. The first electrode 810 may be, for example, an n-type electrode. A plurality of first nano wires 811 are formed on the first electrode 810. The first nano wires 811 may be disposed perpendicular to the first electrode 810. If the first electrode 810 is an n-type electrode, the nano wires 811 may be formed of an n-type semiconductor material. A plurality of semiconductor layers 812 are formed on the nano wires 811, respectively. The semiconductor layers 812 form a p-n junction with the first nano wires 811, respectively. The semiconductor layers 812 may be formed to cover surfaces of the nano wires 811. The semiconductor layers 812 may be formed of, for example, a p-type semiconductor material. A plurality of second electrodes 813 are formed on the semiconductor layers 812, respectively. The second electrodes 813 are formed to cover surfaces of the semiconductor layers 812 and may be p-type electrodes.

A third electrode 820 is formed on a bottom surface of the second plate 802. The third electrode 820 is electrically connected to the second electrodes 813. The third electrode 820 may be formed of a transparent conductive material. A plurality of second nano wires 821 are disposed on a bottom surface of third electrode 820. The second nano wires 821 may be arranged perpendicular to the third electrode 820. The second nano wires 821 are disposed to form a Schottky contact with the first electrode 810. The second nano wire 821 may be formed of a material having piezoelectric properties. The second nano wires 821 may be formed of a material having a work function less than that of the first electrode 810.

In the electrical energy generation apparatus according to example embodiments, a solar battery device having the first nano wires 811 and a piezoelectric device having the second nano wires 821 are combined in a single body. In example embodiments, the first nano wires 811 and the semiconductor layer 812 are formed of an n-type semiconductor material and a p-type semiconductor material, respectively, and the first and second electrodes 810 and 813 are an n-type electrode and a p-type electrode, respectively, but example embodiments are not limited thereto. That is, the first nano wires 811 and the semiconductor layer 812 may be formed of a p-type semiconductor material and an n-type semiconductor material, respectively, and the first and second electrodes 810 and 813 may be a p-type electrode and an n-type electrode, respectively.

As described above, according to example embodiments, it is possible to manufacture an electrical energy generation apparatus in which a solar battery device and a piezoelectric device are combined in a single body by using nano wires formed of a semiconductor material having piezoelectric properties. Such an electrical energy generation apparatus is capable of selectively generating electrical energy from external energy and effectively generating electrical energy regardless of ambient conditions.

The electrical energy generation apparatuses according to example embodiments may be used in any device using solar batteries. For example, the electrical energy generation apparatuses according to example embodiments may be used in photovoltaic applications (e.g., commercial applications such as spacecrafts, satellites and automotives, residential applications, and mobile applications such as cell phones and outdoor lighting sources).

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An electrical energy generation apparatus, comprising:
a first plate and a second plate disposed apart from each other;
a first electrode on the first plate;
a plurality of first nano wires on the first electrode and formed of a semiconductor material;
a plurality of semiconductor layers forming a p-n junction with the first nano wires, respectively, wherein the plurality of semiconductor layers cover surfaces of the first nano wires;
a plurality of second electrodes covering surfaces of the semiconductor layers;
a third electrode on a bottom surface of the second plate; and
a plurality of second nano wires on a bottom surface of the third electrode, wherein the plurality of second nano wires form a Schottky contact with the first electrode.

2. The apparatus of claim 1, wherein the first and second plates include glass, a metal plate, plastic or vinyl.

3. The apparatus of claim 1, the plurality of first nano wires are formed of an n-type semiconductor material, and the plurality of semiconductor layers are formed of a p-type semiconductor material.

4. The apparatus of claim 1, the plurality of second nano wires include a material having piezoelectric properties.

5. The apparatus of claim 1, wherein the plurality of nano wires include a zinc oxide (ZnO), a lead zirconate titanate (PZT) or a polyvinylidene fluoride (PVDF).

6. The apparatus of claim 1, wherein the plurality of semiconductor layers include at least one material selected from the group consisting of an inorganic thin layer, an organic thin layer and a composite inorganic-organic thin layer.

7. The apparatus of claim 1, wherein the first electrode includes at least one material selected from the group consisting of an indium tin oxide (ITO), a carbon nanotube (CNT), graphene, a conducting polymer, nanofiber, a nanocomposite, an alloy of gold and palladium, gold (Au), palladium (Pd), platinum (Pt), ruthenium (Ru) and combinations thereof, and
the second electrode is formed of a transparent conductive material.

8. The apparatus of claim 4, the plurality of second nano wires have a work function that is less than a work function of the first electrode.

9. The apparatus of claim 1, the third electrode is electrically connected with the plurality of second electrodes.

10. The apparatus of claim 1, the third electrode includes a transparent conductive material.

11. The apparatus of claim 1, wherein the third electrode includes at least one material selected from the group consisting of platinum (Pt), gold (Au), an indium tin oxide (ITO), a carbon nanotube (CNT), and graphene.

12. The apparatus of claim 1, the plurality of first nano wires are perpendicular to the first electrode, and the plurality of second nano wires are perpendicular to the third electrode.

* * * * *